United States Patent
Hidese

(10) Patent No.: US 6,588,096 B1
(45) Date of Patent: Jul. 8, 2003

(54) METHOD EMPLOYING X-Y TABLES FOR SIMULTANEOUSLY MOUNTING ELECTRONIC PARTS

(75) Inventor: Wataru Hidese, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/281,222

(22) Filed: Mar. 30, 1999

(30) Foreign Application Priority Data

Apr. 6, 1998 (JP) .......................................... 10-093131

(51) Int. Cl.[7] ................................................ H05K 3/30
(52) U.S. Cl. ..................... 29/832; 29/739; 29/740; 29/721; 29/743; 29/833; 29/834; 29/DIG. 44; 382/151; 382/152; 294/64.1; 414/737; 414/751.1; 414/752.1; 901/40
(58) Field of Search .................... 29/740, 832, 833, 29/712, 721, 743, 836, 739, 742, 783, 784, 791, 794, DIG. 44, 834; 414/737, 751.1, 752.1; 901/40; 294/64.1; 382/151, 100, 152

(56) References Cited

U.S. PATENT DOCUMENTS

| | | | | |
|---|---|---|---|---|
| 5,323,528 A | * | 6/1994 | Baker ........................ | 29/740 X |
| 5,566,447 A | * | 10/1996 | Sakurai ..................... | 29/740 X |
| 5,699,448 A | * | 12/1997 | Gorenflo et al. ............ | 382/151 |
| 5,778,525 A | * | 7/1998 | Hata et al. .................... | 29/836 |

* cited by examiner

Primary Examiner—Richard Chang
(74) Attorney, Agent, or Firm—Stevens, Davis, Miller & Mosher, LLP

(57) ABSTRACT

An electronic parts-mounting method for mounting parts on a board in which at least two electronic parts can be picked up by a plurality of nozzles including a plurality of first nozzles arranged substantially parallel to the direction of movement of the board and a plurality of second nozzles arranged substantially perpendicular to the direction of movement of the board such that the positions of the parts picked up by the second nozzles can be recognized by a line sensor and corrected.

9 Claims, 12 Drawing Sheets

METHOD EMPLOYING X-Y TABLES FOR SIMULTANEOUSLY MOUNTING ELECTRONIC PARTS

BACKGROUND OF THE INVENTION

1. Field of the Invention

This invention relates to an apparatus for and a method of mounting electronic parts, in which transfer heads are horizontally moved so as to transfer and mount electronic parts onto a board.

2. Related Art

There is known an electronic parts-mounting apparatus in which a transfer head is moved horizontally in directions X and Y by an X-Y table mechanism so as to transfer and mount electronic parts, stored in an electronic parts supply portion, onto a board. The electronic parts-mounting apparatus of this kind has advantages in that its construction is simple and that various kinds of electronic parts different in shape and size can be mounted on the board. However, such an apparatus has a disadvantage that the parts-mounting speed is somewhat low since the transfer head must be horizontally moved a long stroke in the directions X and Y.

In order to overcome the above disadvantage, it might be considered to provide an arrangement in which a plurality of electronic parts mounting apparatuses are arranged in a juxtaposed manner, and these electronic parts-mounting apparatuses affect their respective allotted portions of the parts-mounting operation for a single board. In this case, however, unless the layout of the electronic parts-mounting apparatuses is suitably determined, a large installation space is required, and besides the parts-mounting speed is not enhanced. Particularly, the boards, on which the electronic parts are to be mounted, are frequently changed from one kind to another, and when the kind of the boards is changed, a parts-mounting program is also changed. Therefore, the above arrangement is required to be able to suitably deal with a change in the kind of the boards.

SUMMARY OF THE INVENTION

It is therefore an object of this invention to provide an electronic parts-mounting apparatus in which electronic parts can be efficiently mounted on a board or a substrate at high speed.

Another object of the invention is provide an electronic parts-mounting apparatus in which the layout of the apparatus can be suitably changed in accordance with the kind of boards or substrates to be used.

A further object of the invention is to provide an apparatus for and a method of mounting electronic parts, in which the picking-up of electronic parts, as well as the recognition of the positions of these electronic parts, can be effected at high speed.

According to one aspect of the present invention, here is provided an electronic parts-mounting apparatus comprising a plurality of unit electronic parts-mounting apparatuses each comprising (a) a bed, (b) a board or substrate transfer path provided on the bed, (c) an even number of X-Y table mechanisms which are provided above the bed, and are arranged symmetrically in a direction X and a direction Y as viewed from the top, (d) an even number of head portions provided respectively at the even number of X-Y table mechanisms, and (e) electronic parts supply portions provided on opposite sides of the transfer path for supplying electronic parts to the even number of head portions; the plurality of unit electronic parts-mounting apparatuses being adapted to be arranged in such a juxtaposed manner that the transfer paths of the unit electronic parts-mounting apparatuses may be linearly continuous with each other.

Preferably, the head portion has a plurality of nozzles arranged in a circle, and the electronic parts supply portion comprises parts feeders juxtaposed to each other in the direction X, and the distance between the adjacent nozzles in the direction X is an integral multiple of a pitch of the juxtaposed parts feeders, so that at least two electronic parts can be picked up simultaneously by at least two of the plurality of nozzles, respectively.

Preferably, the head portion has a plurality of nozzles arranged in a circle, and recognition units for the electronic parts are provided on the opposite sides of the transfer path, and the head portion is movable to a position above the associated recognition unit, so that images of at least two of the electronic parts, held respectively by the plurality of nozzles by suction, may be picked up simultaneously and whereby the positions of these electronic parts may be recognized.

According to another aspect of the invention, there is provided an electronic parts-mounting apparatus comprising (a) a bed, (b) a board or substrate transfer path provided on the bed, (c) an even number of X-Y table mechanisms which are provided above the bed, and are arranged symmetrically in a direction X and a direction Y as viewed from the top, (d) an even number of head portions provided respectively at the even number of X-Y table mechanisms, (e) electronic parts supply portions provided on opposite sides of the transfer path for supplying electronic parts to the even number of head portions, and (f) means for defining between the adjacent electronic parts supply portions a space for an operator to enter.

According to a further aspect of the invention, there is provided an electronic parts-mounting apparatus comprising (a) a bed, (b) a board or substrate transfer path provided on the bed, (c) an X-Y table mechanism movable in a direction X and a direction Y above the bed, (d) a head portion provided at the X-Y table mechanism, and (e) an electronic parts supply portion provided on a side of the transfer path for supplying electronic parts to the head portion; the head portion comprising a plurality of nozzles arranged in a circle and each having an axis, means for moving the nozzles upward and downward, and rotation means for rotating the nozzles in a direction θ or about their axes.

Preferably, the rotation means comprises a plurality of gears for respectively rotating the plurality of nozzles, and a gear which is provided at a central portion of the head portion and is in mesh with the plurality of gears so as to transmit a drive force from a drive source thereto.

The gear for transmitting the drive force from the drive source may be a double-gear having upper and lower gears. Further, it is preferable that the distance between the adjacent nozzles in the direction X is an integral multiple of a pitch of juxtaposed parts feeders in the electronic parts supply portion.

According to a still further aspect of the invention, there is provided an electronic parts-mounting method wherein an even number of head portions are moved above a board or substrate transfer path, and electronic parts are picked up from electronic parts supply portions by nozzles of the head portions, respectively, and are transferred to and mounted on a board or a substrate, the method comprising the steps of:

setting an electronic parts-mounting program in such a manner that the times, required respectively for the even number of head portions to effect the mounting of the electronic parts, are generally equal to one another;

moving the even number of head portions in a direction X and a direction Y in accordance with the program respectively by an even number of X-Y table mechanisms provided above the transfer path;

holding and picking up the electronic parts, stored in the electronic parts supply portions provided on opposite sides of the transfer path, respectively by lower ends of the nozzles of each head portion by suction; and transferring and mounting the picked-up electronic parts onto the board.

According to a further aspect of the invention, there is provided an electronic parts-mounting method wherein a head portion is moved above a board or substrate transfer path, and electronic parts are picked up from electronic parts supply portions by nozzles of the head portion, respectively, and are transferred to and mounted on a board or a substrate, the method comprising the steps of:

projecting at least one of the nozzles arranged in a circle in the head portion;

moving the head portion downward; picking up the electronic part from the electronic parts supply portion by the projected nozzle;

moving the head portion upward after the electronic part is picked up; and repeating the above steps, thereby causing all of the nozzles to pick up the electronic parts, respectively.

In the above method, preferably, the distance between the adjacent nozzles in a direction X is an integral multiple of a pitch of juxtaposed parts feeders in the electronic parts supply portion, and a plurality of electronic parts are picked up simultaneously.

According to a still further aspect of the invention, there is provided an electronic parts-mounting method wherein a head portion is moved above a board or substrate transfer path, and electronic parts are picked up from electronic parts supply portions by nozzles of the head portion, respectively, and images of the picked-up electronic parts are picked up by a recognition unit, and whereby the positions of the electronic parts are recognized, and subsequently the electronic parts are transferred to and mounted on a board or a substrate, the method comprising the steps of:

moving the electronic parts, picked up respectively by all of the nozzles, which are arranged in a circle in the head portion, to a position above the recognition unit;

picking up simultaneously the images of at least two of the electronic parts, picked up respectively by all of the nozzles;

recognizing the positions of the electronic parts after picking up the images thereof; and correcting the positions of the electronic parts in accordance with results of the recognition, and subsequently mounting the electronic parts on the board.

In the above construction, the even number of head portions of each unit electronic parts-mounting apparatuses mount the electronic parts on the board. The plurality of unit electronic parts-mounting apparatuses are juxtaposed to each other, and the number of the unit electronic parts-mounting apparatuses is determined in accordance with the kind of the boards to be used. In this case, those unit electronic parts-mounting apparatuses, which are not necessary for the electronic parts-mounting operation, are not used, or are moved to another place so as to effect an electronic parts-mounting operation in another production line.

The plurality of nozzles of the head portion are arranged in a circle, and with this arrangement, two electronic parts can be picked up simultaneously from the parts feeders, respectively, and also the positions of the two electronic parts can be recognized simultaneously.

DESCRIPTION OF THE PREFERRED EMBODIMENT

A preferred embodiment of the present invention will now be described with reference to the drawings.

Figure 1:
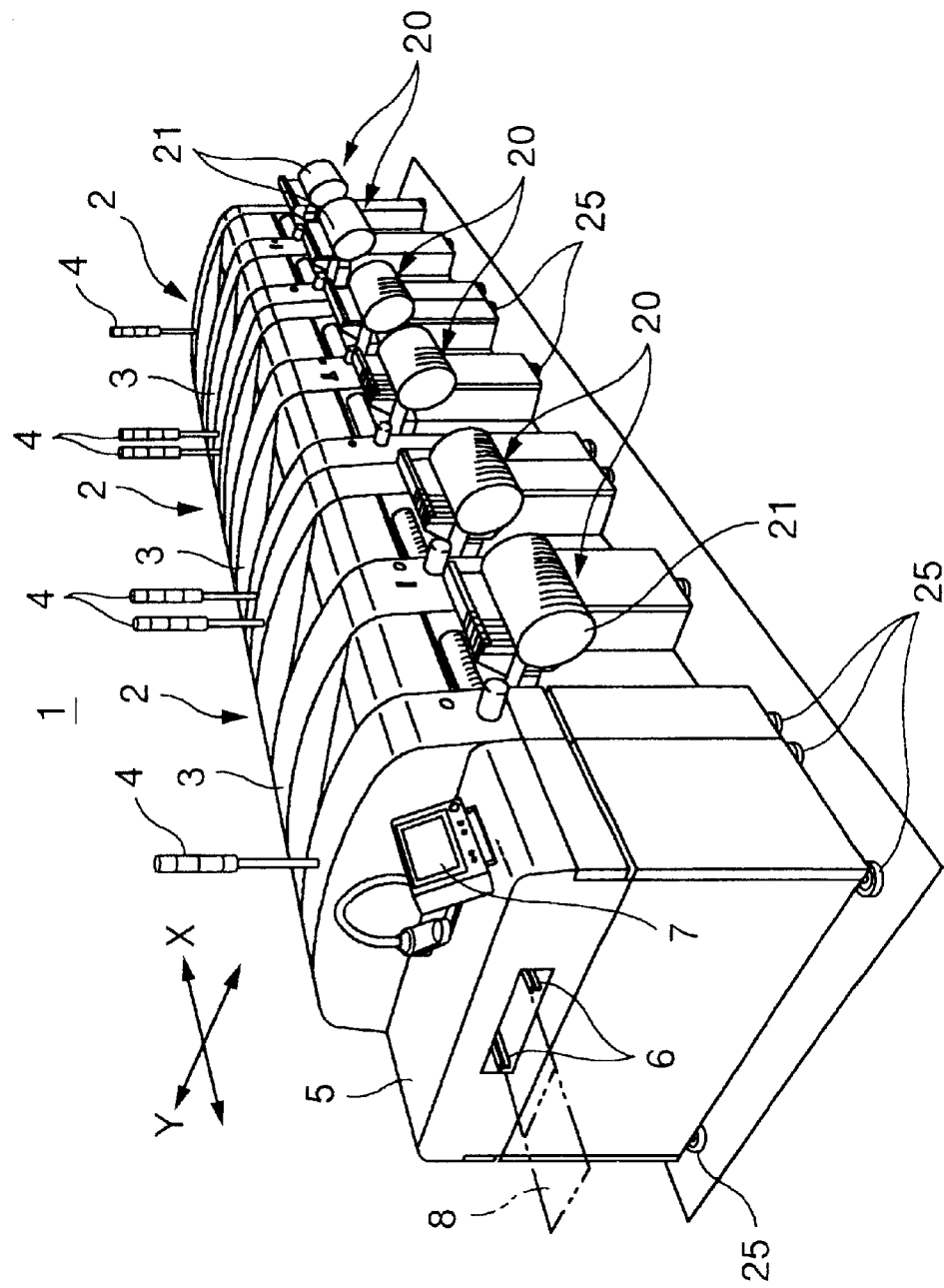
FIG. 1 is a perspective view showing an appearance of an electronic parts-mounting apparatus according to one preferred embodiment of the invention.

The overall construction of the electronic parts-mounting apparatus will first be described with reference to FIG. 1. In FIG. 1, the electronic parts-mounting apparatus 1 comprises three unit electronic parts-mounting apparatuses 2 arranged in a juxtaposed manner. The unit electronic parts-mounting apparatus 2 is covered with a cover case 3. Two alarm lamps 4 are mounted in an upstanding manner on each of the unit electronic parts-mounting apparatuses 2. A board-introducing portion 5 is provided at a left side (upstream side) of the most upstream unit electronic parts-mounting apparatus 2. The board-introducing portion 5 contains a conveyor 6 for feeding a board or a substrate 8 to the unit electronic parts-mounting apparatuses 2. A television monitor 7 is mounted, for example, on the board-introducing portion 5. The board 8, on which electronic parts are mounted by the unit electronic parts-mounting apparatus 2, is displayed in the television monitor 7.

Figure 2:
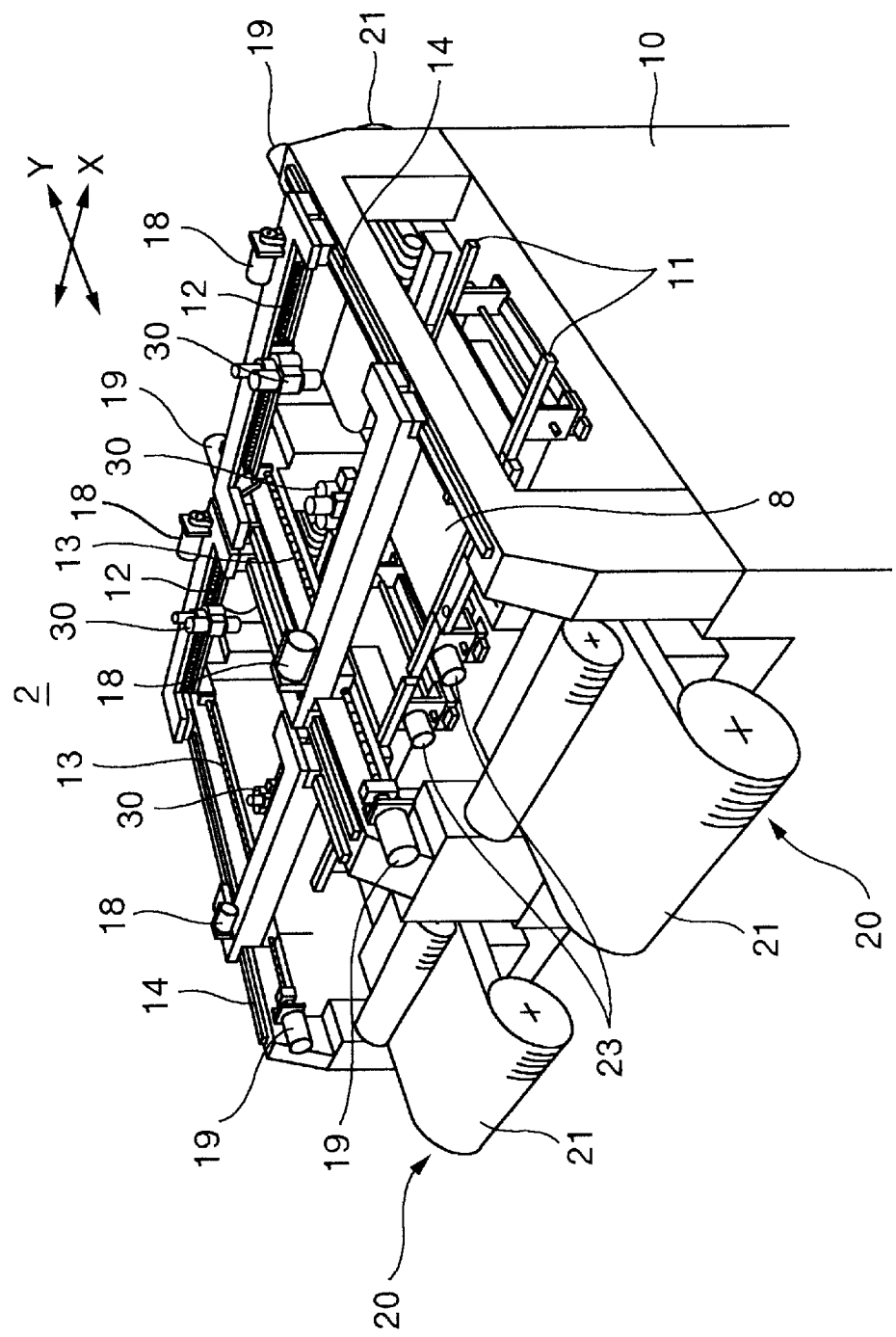
FIG. 2 is a perspective view of a unit electronic parts-mounting apparatus.
Figure 3:
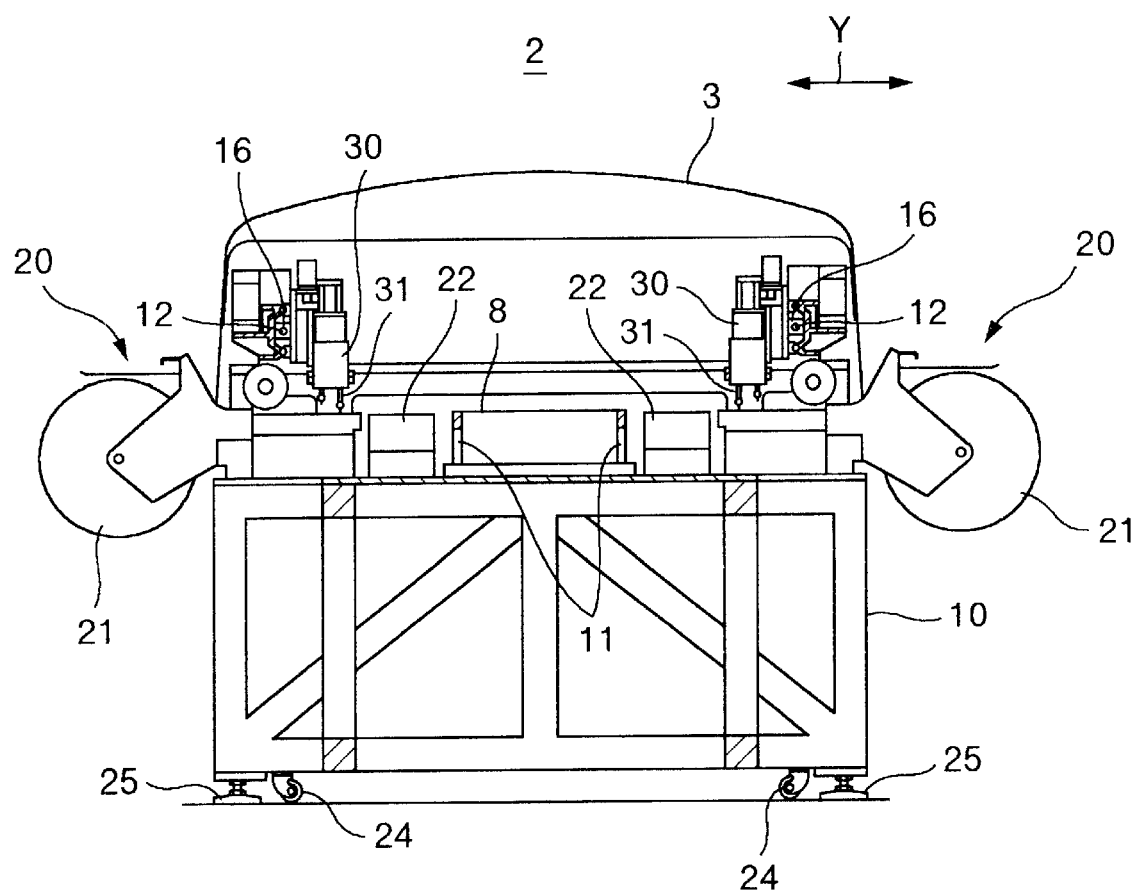
FIG. 3 is a side-elevational view of the unit electronic parts-mounting apparatus.
Figure 4:
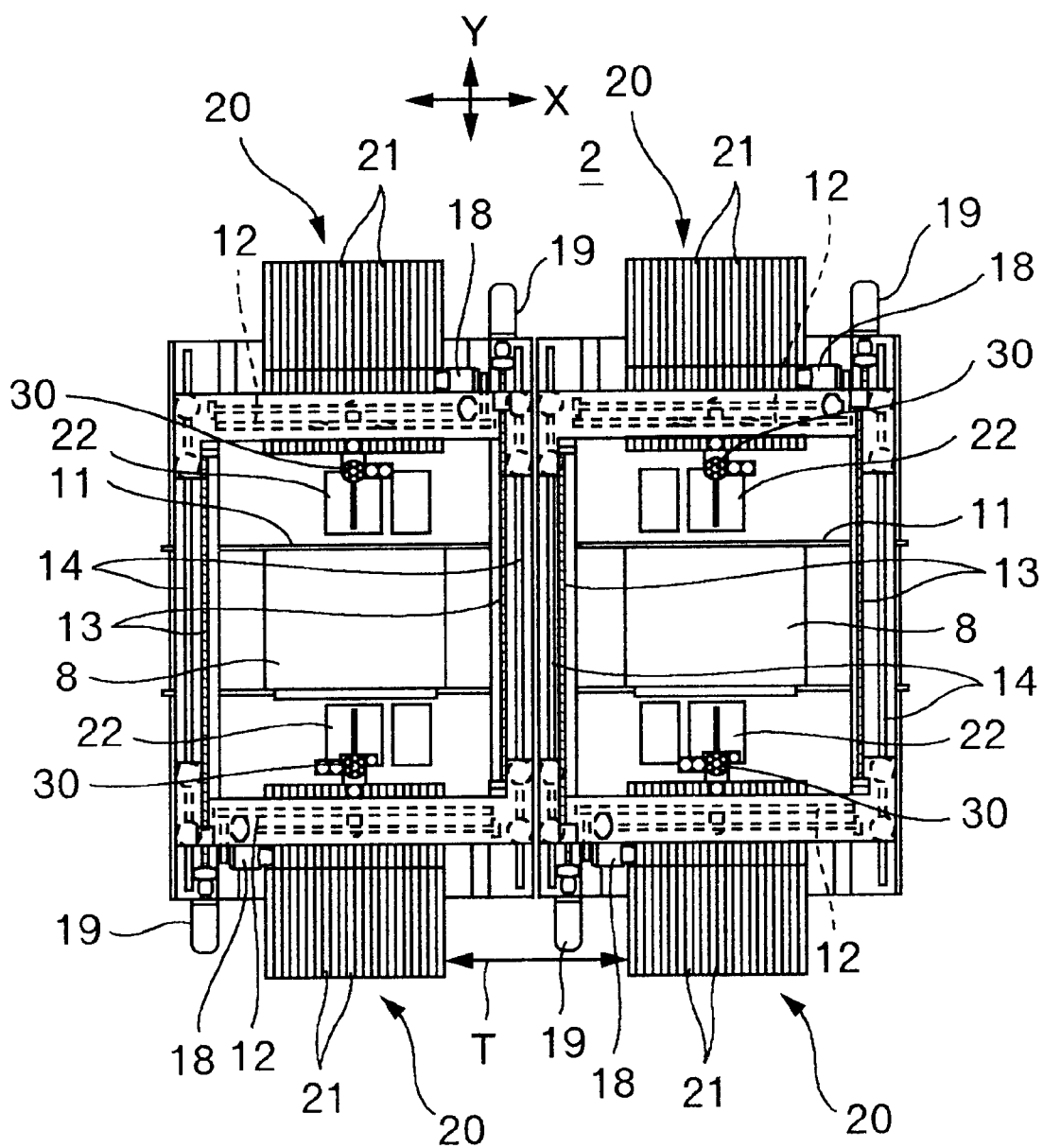
FIG. 4 is a plan view of the unit electronic parts-mounting apparatus.

FIG. 2 shows the unit electronic parts-mounting apparatus 2, with the cover case 3 removed. FIG. 3 is a side-elevational view of the unit electronic parts-mounting apparatus, and FIG. 4 is a plan view thereof. In FIGS. 2 to 4, transfer rails 11 (constituting a transfer path) for the board 8 are provided on a central portion of an upper surface of a bed 10. The conveyor 6 (FIG. 1) feeds board 8 to this transfer path 11. The unit electronic parts-mounting apparatus 2 includes an even number of (four in this embodiment) X-Y table mechanisms arranged symmetrically in a direction X and a direction Y as viewed from the top. The four X-Y table mechanisms have the same construction, and each of these mechanisms includes an X-direction feed screw 12 and a Y-direction feed screw 13 which are disposed perpendicular to each other. There are provided guide rails 14 which extend in the direction Y, and hence are parallel to the feed screws 13. The direction of transfer of the board 8 along the transfer path 11 is the direction X, and the direction perpendicular to this direction is the direction Y.

An end of the X-direction feed screw 12 is connected to the Y-direction feed screw 13 through a nut (not shown). A nut 16 (FIG. 3) is threaded on the X-direction feed screw 12, and the head portion 30 is mounted on the nut 16. Therefore, the number of the head portions 30 is equal to the even number of the X-Y table mechanisms. The head portion 30 includes a plurality of nozzles 31 each for holding an electronic part by suction (vacuum). Therefore, when a motor 18 is driven, the feed screw 12 is rotated, and the head portion 30 is horizontally moved in the direction X along the feed screw 12. When a motor 19 is driven, the feed screw 12 is horizontally moved in the direction Y along the feed screw 13, so that the head portion 30 is moved in the same direction. Namely, the feed screw 12, the feed screw 13, the motor 18 and the motor 19 constitute the X-Y table mechanism for horizontally moving the head portion 30.

Electronic parts supply portions 20 are provided at opposite sides of the bed 10. A number of tape feeders (serving as parts feeders) 21 are provided in a juxtaposed manner at the electronic parts supply portion 20. Instead of the tape feeders 21, tube feeders, bulk feeders or the like can be used as the parts feeders. A recognition unit 22 is provided between each electronic parts supply portion 20 and the transfer path 11. The head portion 30 is moved in the direction X and the direction Y by the X-Y table mechanism, and at this time the electronic part in the tape feeder 21 is held by suction and picked up by a lower end of each nozzle 31, and the head portion 30 is moved to a position above the recognition unit 22. Then, the positions of the electronic parts thus picked up are optically detected by the recognition unit 22, and then the head portion 30 is moved to a position above the board 8, and the electronic parts are mounted on the board 8.

In FIG. 4, a space T is provided between the adjacent electronic parts supply portions 20, and the operator enters this space so as to effect the maintenance of the internal mechanisms. Heretofore, the operator, while leaning over the parts feeder, has effected the maintenance of the internal mechanisms, and therefore the operator could not easily reach the internal mechanisms, and the efficiency of this operation was very poor. In this embodiment, however, the operator enters the space T when effecting the maintenance of the internal mechanisms, and therefore the operator can easily reach the internal mechanisms, and the efficiency of the operation is enhanced.

In FIG. 2, motors 23 are provided for narrowing the width of the transfer path 11. When another kind of boards, which are different in width from the boards 8, are to be used, the motors 23 are driven to move one transfer rail 11 in the direction Y, thereby adjusting the distance between the transfer rails 11.

In FIG. 3, casters 24 and floor-contact members 25 are mounted on the bed 10. The floor-contact members 25 are lifted, so that only the casters 24 are held in contact with the floor surface. By doing so, the unit electronic parts-mounting apparatus 2 can be moved over the floor surface so that the layout of the unit electronic parts-mounting apparatuses 2 can be changed. When the floor-contact members 25 are held against the floor surface, the unit electronic parts-mounting apparatus 2 is fixed on the floor surface.

Figure 5:
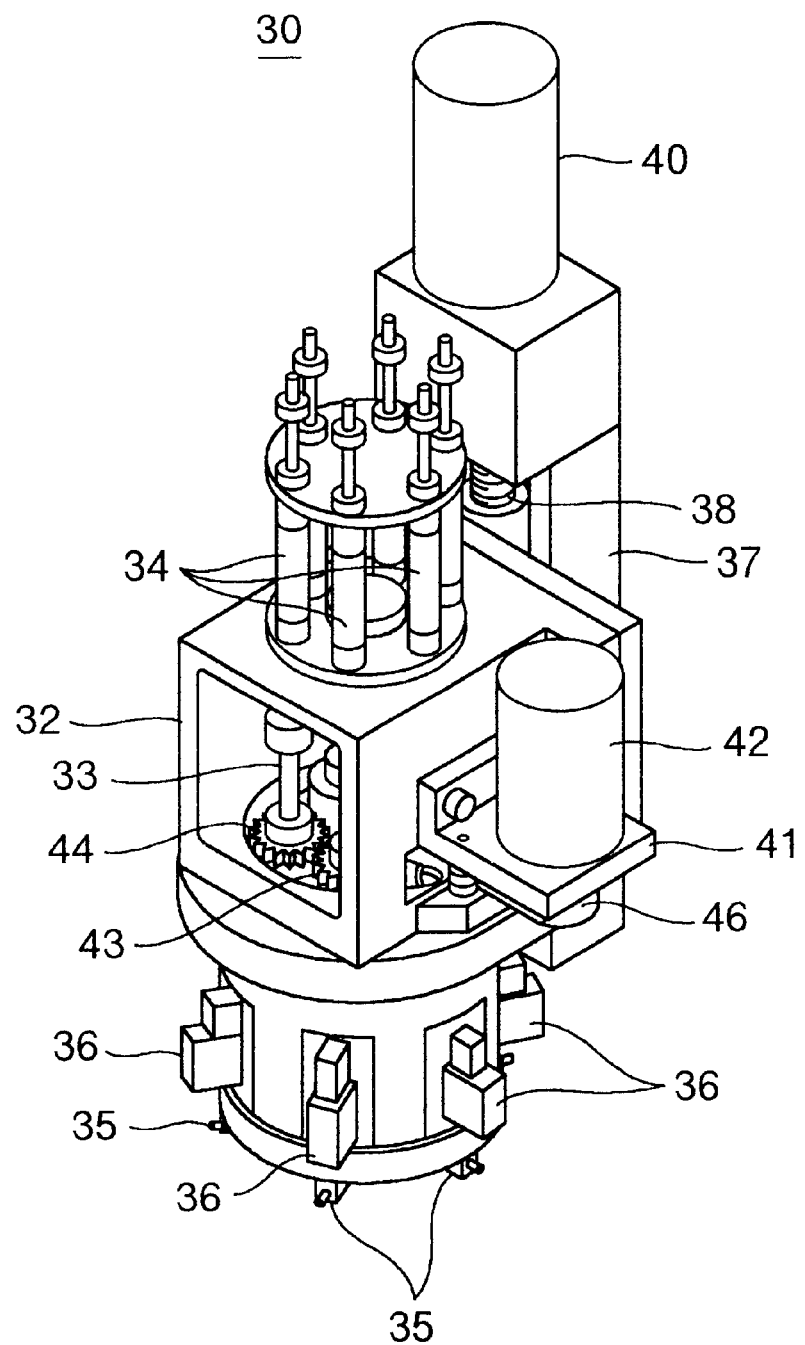
FIG. 5 is a perspective view of a head portion.
Figure 6:
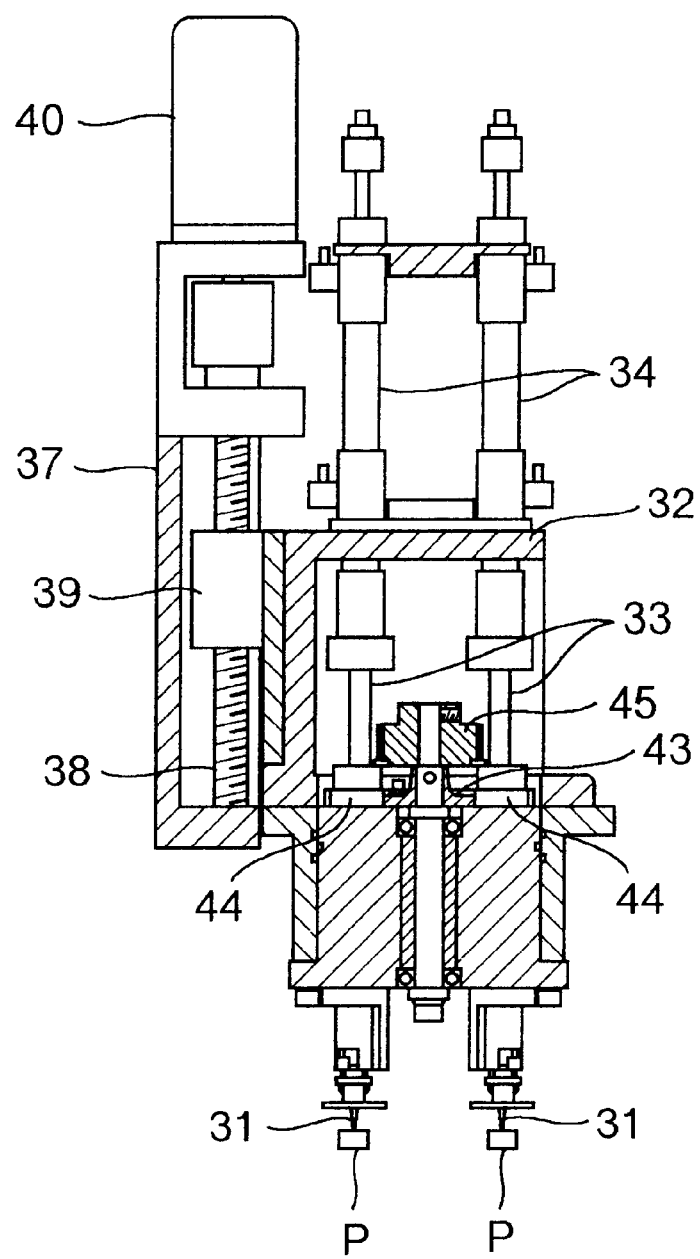
FIGS. 6 and 7 are cross-sectional views of the head portion.
Figure 7:
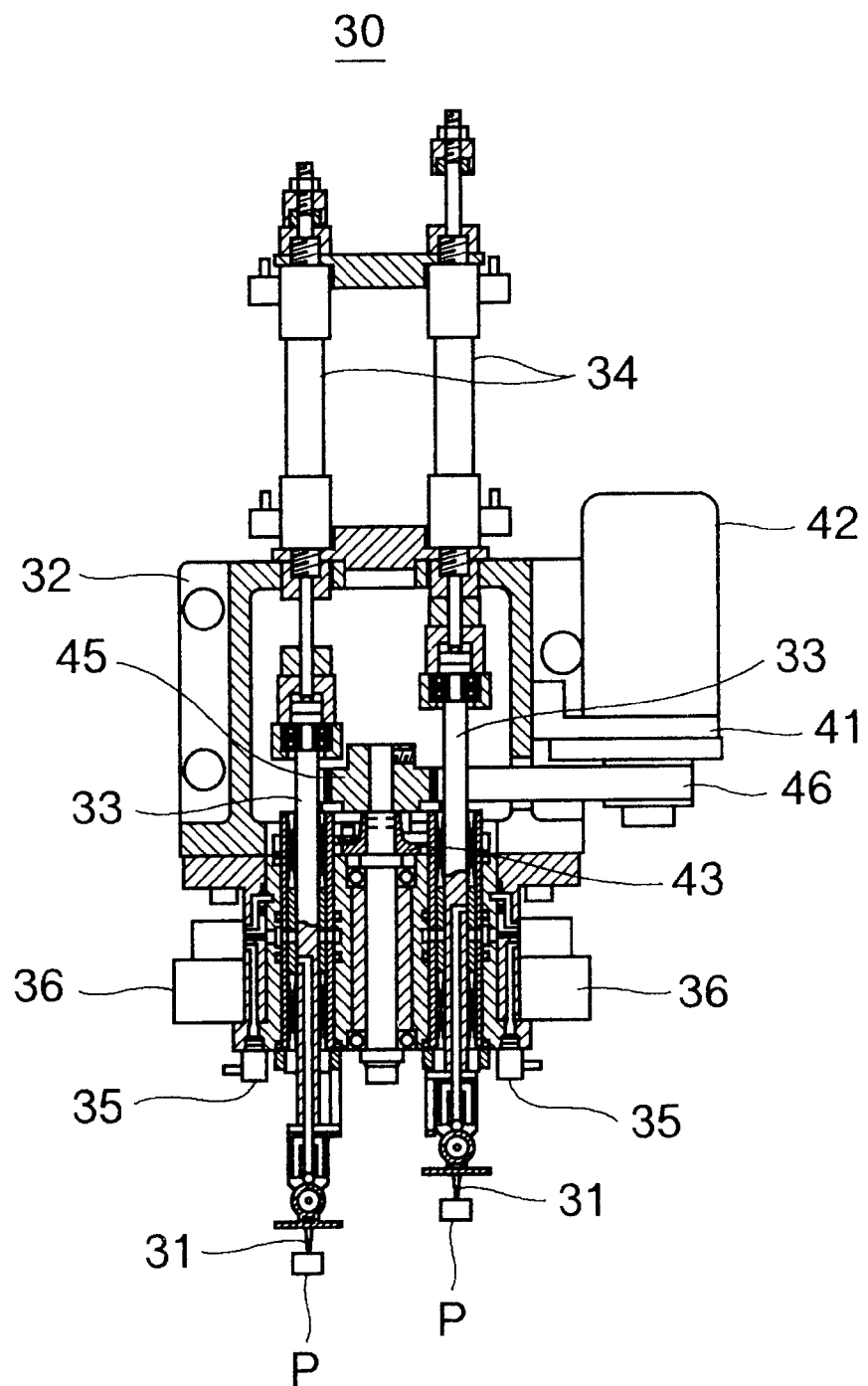

Next, the construction of the head portion 30 will be described with reference to FIGS. 5 to 8. In FIGS. 5 to 7, a plurality of (six (even number) in this embodiment) vertical shafts 33 extend through a box-shaped body 32. The nozzle 31 for holding the electronic part P by suction (vacuum) is provided at a lower end of each shaft 33. The six nozzles 31 are arranged in a circle as viewed from the top (see FIG. 8). A cylinder 34 is provided just above each shaft 33. When the cylinder 34 is operated, the associated shaft 33 and nozzle 31 are moved upward and downward. Namely, the cylinder 34 serves as means for moving the nozzle 31 upward and downward. The nozzle 31, best suited for the electronic part P to be picked up, is selected among the six nozzles 31, and is used. The selected nozzle 31 is projected downward by operating the associated cylinder 34. In FIG. 7, the left-hand nozzle 31 is the one which has been selected and projected downward. The interior of each nozzle 31 is connected to vacuum evacuation means (not shown) via a joint 35. Reference numeral 36 denotes a valve unit for opening and closing a vacuum evacuation passage.

In FIGS. 5 and 6, a U-shaped frame 37 is mounted on a rear surface of the body 32. A vertical feed screw 38 extends through the frame 37. A nut 39 is fixedly secured to the body 32, and this nut 39 is threaded on the feed screw 38. A motor 40 for rotating the feed screw 38 is mounted on the frame 37. Therefore, when the motor 40 is driven to rotate the feed screw 38, the nut 39 moves upward and downward along the feed screw 38, and therefore the body 32 and the nozzles 31 also move upward and downward. Namely, the feed screw 38, the nut 39 and the motor 40 jointly constitute means for moving the nozzles 31 upward and downward, and by moving the nozzles 31 upward and downward, each nozzle 31 holds and picks up the electronic part P, stored in the parts feeder 21, by suction, and the electronic part thus picked up is mounted on the board 8.

Figure 8:
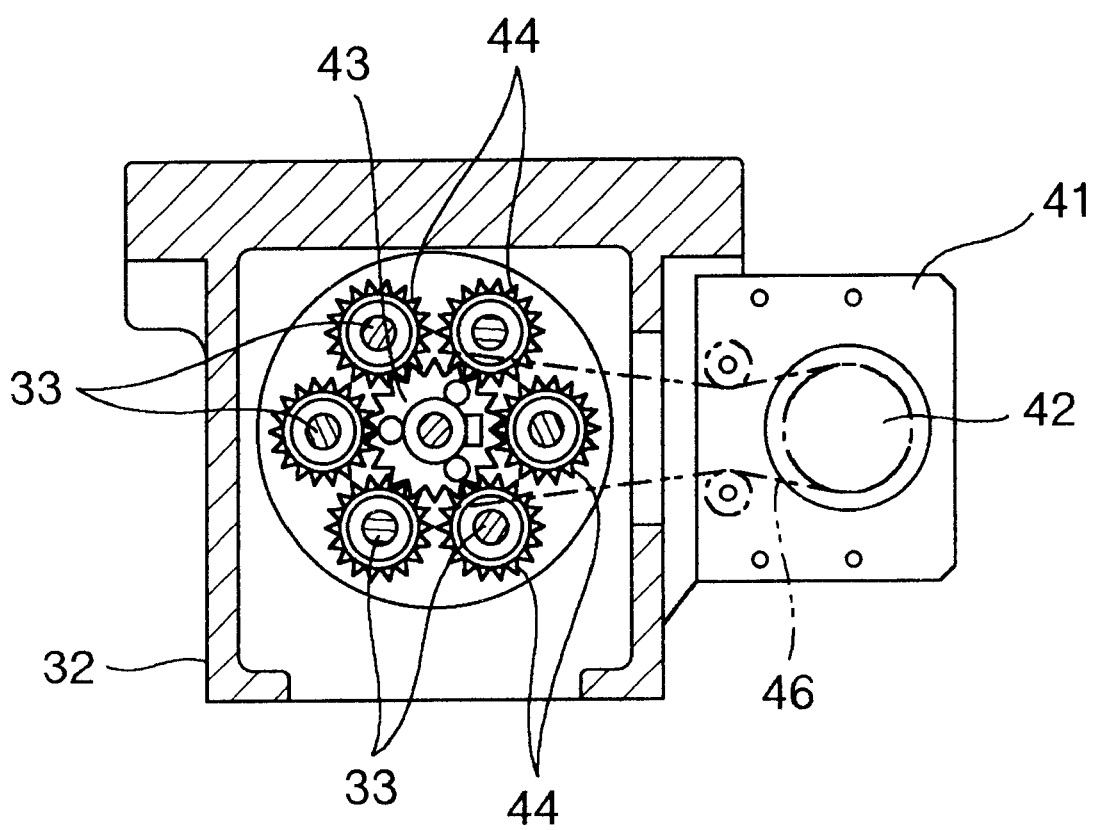
FIG. 8 is a horizontal cross-sectional view of the head portion.

Next, θ rotation means for the nozzles 31 will be described. In FIG. 5, a frame 41 is mounted on a side surface of the body 32, and a motor 42 is mounted on the frame 41. In FIGS. 7 and 8, a gear 43 is provided within the body 32 at a central portion thereof. A gear 44 is mounted on each of the six shafts 33, and the six gears 44 are in mesh with the gear 43. A pulley 45 is provided coaxially with the gear 43, and a timing belt 46 is extended around the pulley 45 and a rotation shaft of the motor 42. Therefore, when the motor 42 is driven to rotate the pulley 45, the gear 43 and the gears 44 are rotated. When each gear 44 is rotated, the associated shaft 33, as well as the associated nozzle 31, rotates about a vertical axis thereof, so that the direction θ (horizontal rotation direction) of the electronic part P, held by the lower end of the nozzle 31 by suction, is adjusted. Namely, the motor 42, the gear 43, the gears 44, the pulley 45 and the timing belt 46 constitute the θ rotation means for the nozzles 31. The gear 43 is of a double-gear construction having upper and lower gears in order to eliminate backlash.

Figure 9:
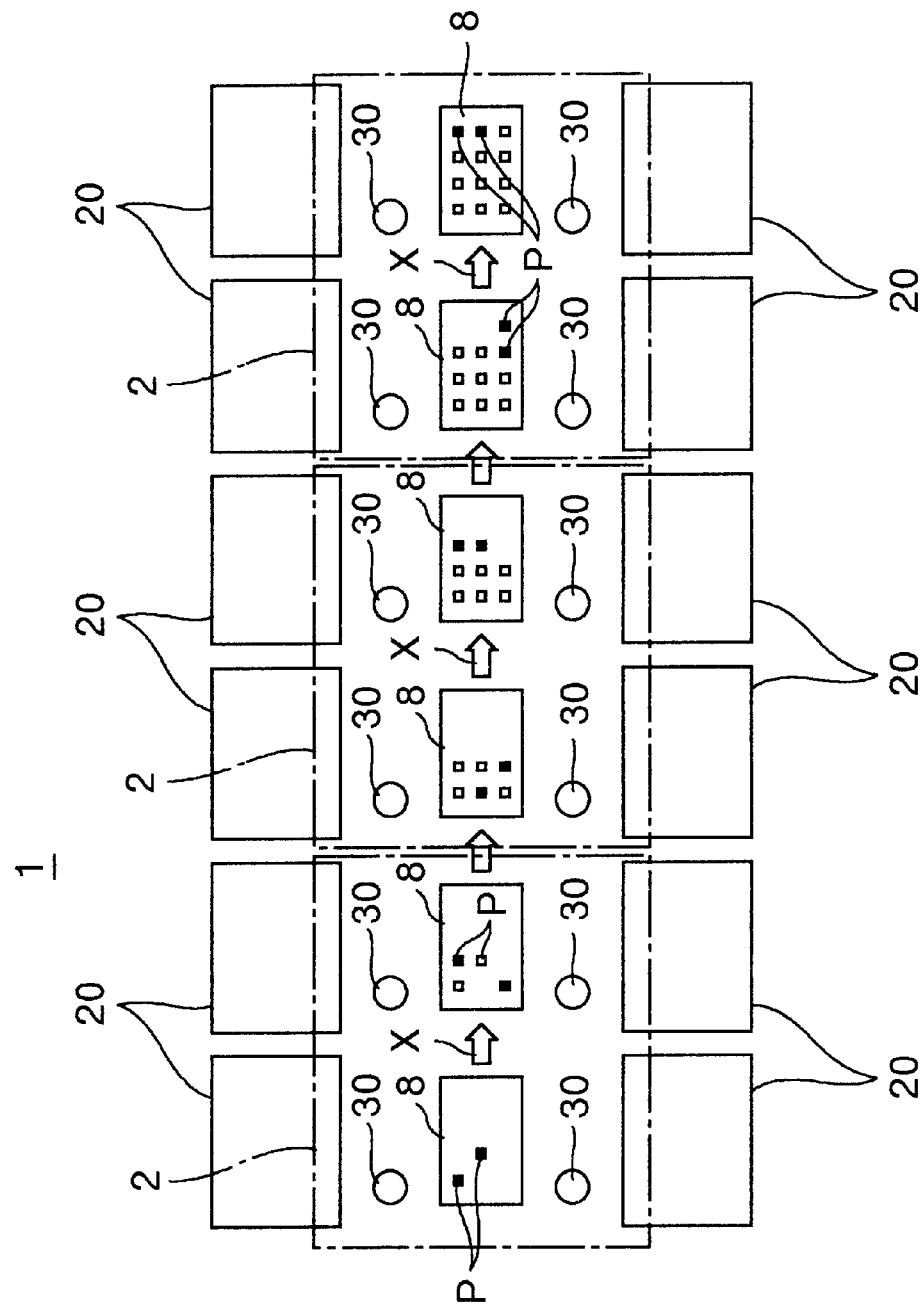
FIG. 9 is a view showing an overall layout of the electronic parts-mounting apparatus.

The electronic parts-mounting apparatus of this embodiment has the above construction, and its handling operation will now be described. In accordance with the kind of boards on which the electronic parts are to be mounted, a necessary number of unit electronic parts-mounting apparatuses 2 are arranged in a juxtaposed manner on the floor to provide the electronic parts-mounting apparatus. In the example shown in FIGS. 1 and 9, three unit electronic parts-mounting apparatuses 2 are juxtaposed to one another. FIG. 9 provides a schematic illustration for better understanding. In this condition, the transfer paths 11 of the three unit electronic parts-mounting apparatuses 2 are linearly continuous with one another. Each unit electronic parts-mounting apparatus 2 includes the four head portions 30, and therefore in the example shown in FIG. 9, the electronic parts are mounted on one board 8 by the 12 head portions 30. In this case, an electronic parts-mounting program is so determined that the times, required respectively for the three unit electronic parts-mounting apparatuses to effect the mounting of the electronic parts, are generally equal to one another. Also, the times, required respectively for the four head portions 30 to effect the mounting of the electronic parts, are generally equal to one another. The boards 8 are fed step by step in the direction X, and the electronic parts are mounted on the boards 8. Those electronic parts P, indicated in black in FIG. 9, are the electronic parts P mounted on the board by the corresponding head portions 30.

Each head portion 30 is moved to the position above the electronic parts supply portion 20, and picks up the electronic parts P, and passes over the recognition unit 22, and then mounts the electronic part P on the board 8. First, a method of picking up the electronic parts P by the head portion 30 will be described with reference to FIGS. 10 and 11.

Figure 10:
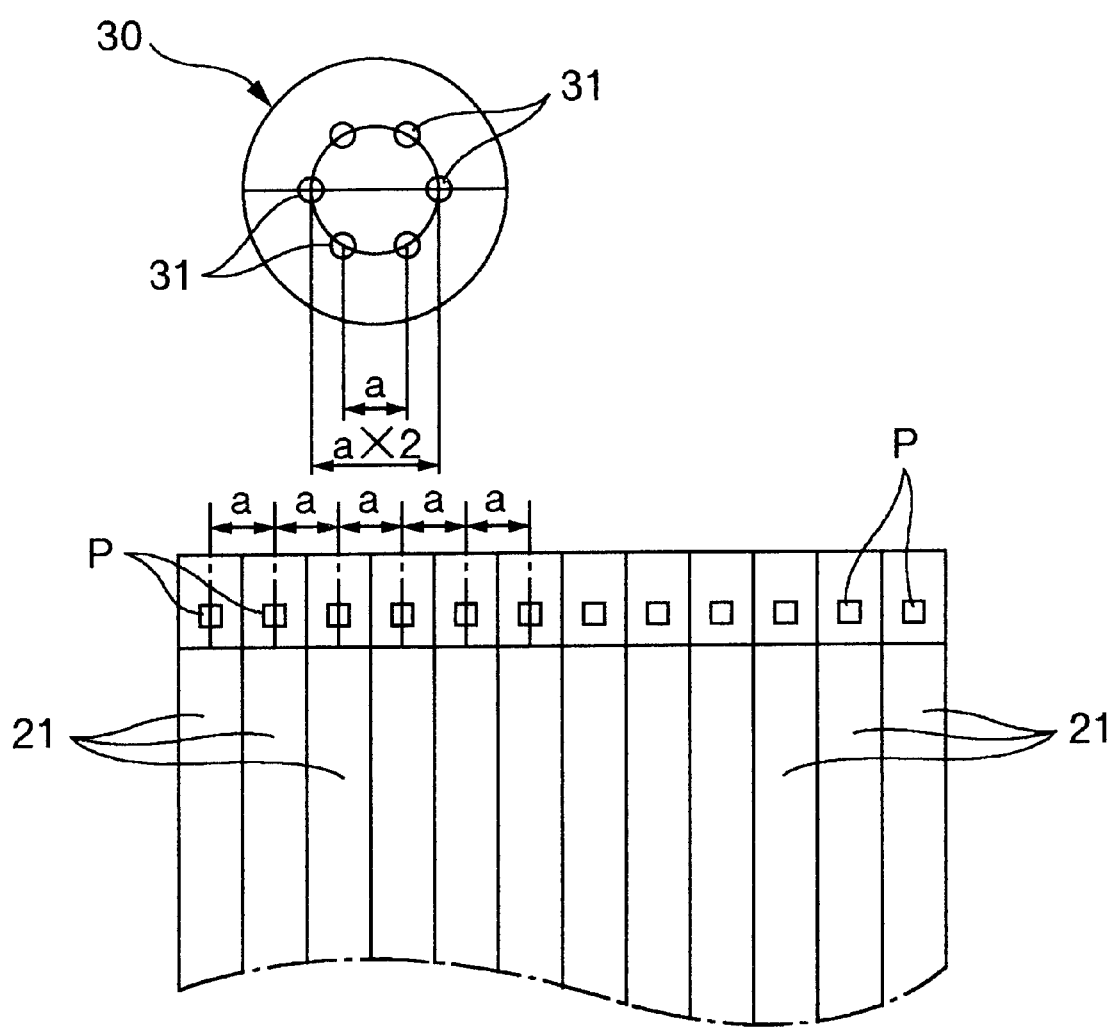
FIG. 10 is a plan view of parts feeders and the head portion.

In FIG. 10, reference characters P denote the electronic parts fed to a pick-up position at front ends of the parts feeders 21. In FIG. 10, reference character a denotes a pitch at which the parts feeders 21 are juxtaposed to one another. The head portion 30 has the six nozzles 31 arranged in a circle. The distance between the centers of the two lower nozzles 31 (FIG. 10), as well as the distance between the centers of the two upper nozzles 31, is a, and the distance between the centers of the two intermediate nozzles 31 is (a×2). Namely, the distance between any two adjacent ones of an even number of nozzles 31 of the head portion 30 in the direction X is an integral multiple (a, a×2) of the pitch of the electronic parts P in the Juxtaposed parts feeders 21.

Figure 11A:
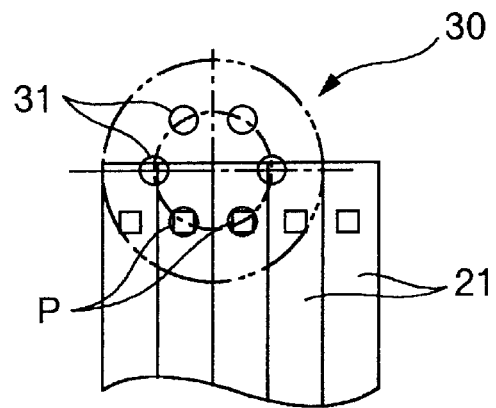
FIGS. 11A to 11C are views explanatory of the picking-up of electronic parts in parts feeders by the head portion.

FIG. 11 shows a method in which the electronic parts P in the parts feeders 21 are picked up by the six nozzles 31. First, two electronic parts P in the two adjacent parts feeders 21 are picked up by the two lower nozzles 31, respectively, as shown in FIG. 11A. In this case, since the distance a between the two nozzles 31 is equal to the pitch a of the electronic parts P in the parts feeders 21, the two electronic parts P can be picked up simultaneously by the two nozzles 31, respectively.

Figure 11B:
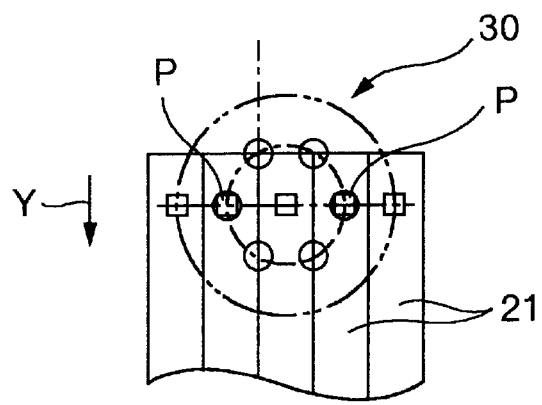
Figure 11C:
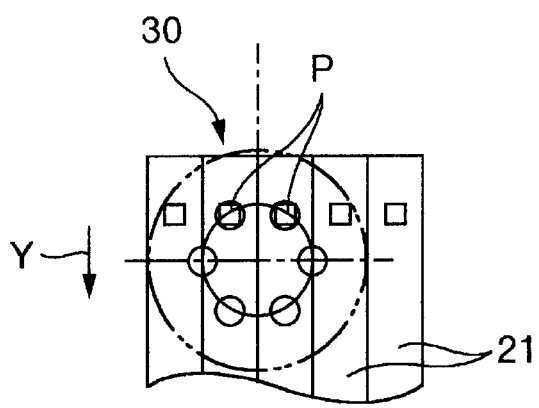

Then, the head portion 30 is moved in the direction Y and direction X to locate the two intermediate nozzles 31 respectively above the electronic parts P spaced 15 from each other by a distance equal to two pitches (a×2) as shown in FIG. 11B, and the two electronic parts P are simultaneously picked up by these nozzles 31, respectively. Then, the head portion 30 is further moved in the direction Y and direction X, and similarly, two electronic parts P are picked up by the two upper nozzles 31, respectively, as shown in FIG. 11C.

As described above, the pitch of the parts feeders 21 is set to a, and the distance between the adjacent nozzles 31 in the direction X is set to a or (a×2), and therefore two electronic parts P can be picked up simultaneously by the two nozzles 31, respectively. Therefore, the time, required for picking up the electronic parts P, can be reduced.

Figure 12:
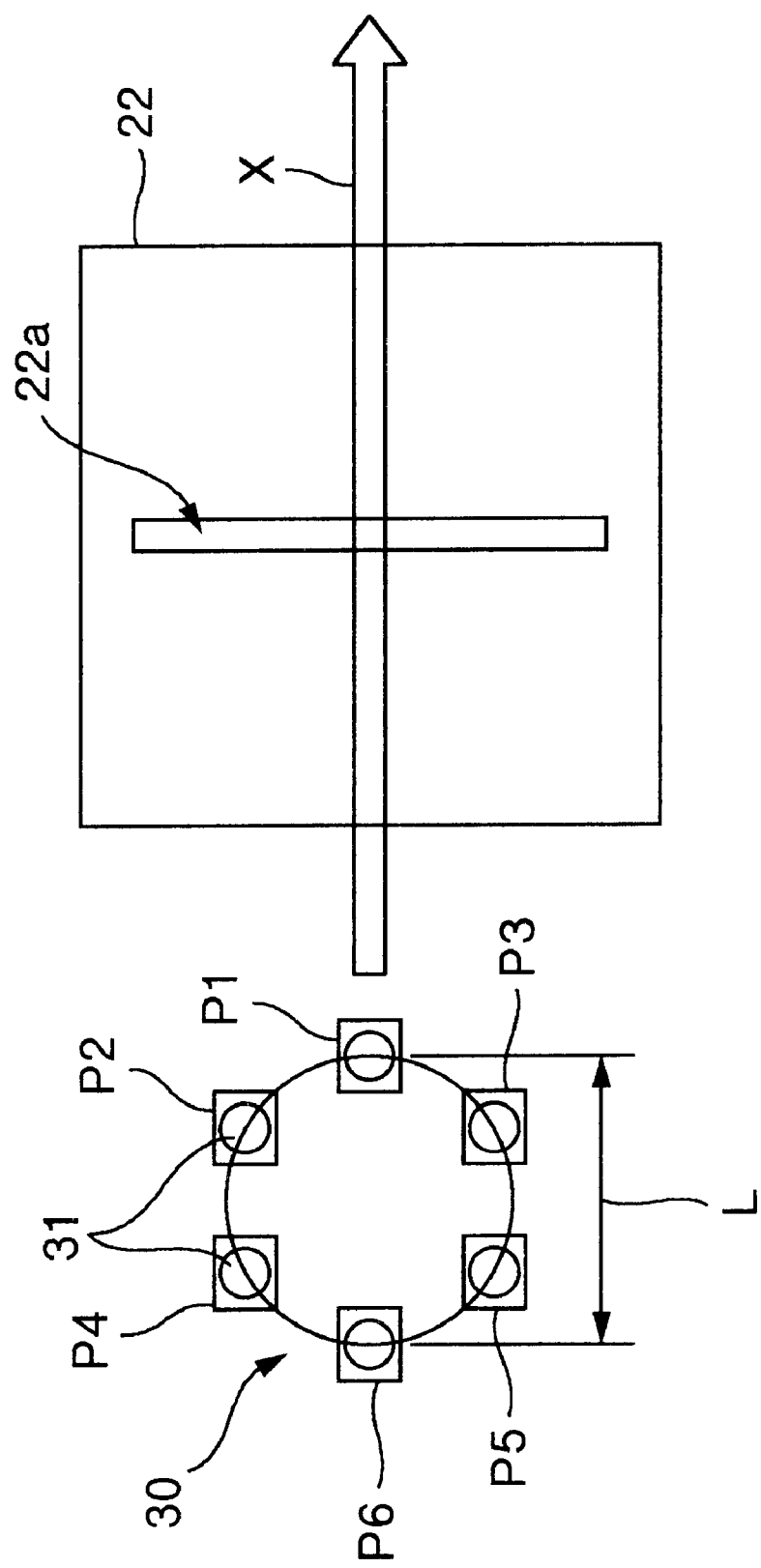
FIG. 12 is a view explanatory of the recognition of the electronic parts.

The head portion 30, which has picked up the electronic parts P from the parts feeders 21, is moved to the position above the recognition unit 22, and the recognition of the electronic parts P is effected. Next, a method of recognizing the electronic parts P will be described with reference to FIG. 12. In FIG. 12, the recognition unit 22 in this embodiment contains a line sensor, and a slit 22a for picking up an image is formed in an upper surface thereof. The head portion 30 is moved above the recognition unit 22 in the direction X, and the electronic parts P, held respectively by the nozzles 31 by suction, are scanned, and their plan images are picked up. In FIG. 12, suffixes 1 to 6 are added to reference characters P in order to distinguish the six electronic parts P from one another.

When the head portion 30 is moved in the direction X, the image of the electronic part P1, held by the leading (first) nozzle 31 by suction, is picked up. Subsequently, the images of the two electronic parts P2 and P3, held respectively by the two second nozzles 31 by suction, are picked up simultaneously. Then, the images of the two electronic parts P4 and P5, held respectively by the two third nozzles 31 by suction, are picked up simultaneously. Finally, the image of the electronic part P6, held by the fourth nozzle P6 by suction, is picked up.

As described above, the images of the two electronic parts P2 and P3, as well as the images of the two electronic parts P4 and P5, are picked up simultaneously, and therefore the images of the six electronic parts P1 to P6 can be picked up by the four image pick-up operations. And besides, since the six nozzles 31 are arranged in a circle, the scanning distance L for picking up the images of all (6 in this embodiment) of the electronic parts P1 to P6 can be reduced. There has heretofore been used a head portion having a plurality of nozzles arranged linearly in a row, and in such a head portion, the scanning distance for picking up the images of the electronic parts is long, and as a result the recognition precision is liable to be lowered, and one example thereof is the deformed image.

As described above, in the present invention, the electronic parts-mounting apparatus is constituted by the plurality of juxtaposed unit electronic parts-mounting apparatuses each comprising the four X-Y table mechanisms, arranged symmetrically in the direction X and the direction Y as viewed from the top, the four head portions provided respectively at the four X-Y table mechanisms, and the electronic parts supply portions provided on the opposite sides of the board transfer path for supplying the electronic parts to the four head portions. Therefore, the electronic parts can be efficiently mounted on the board, and also the layout of the unit apparatuses can be suitably changed in accordance with the kind of the boards to be used. And besides, the picking-up of the electronic parts, as well as the recognition of the positions of the electronic parts, can be effected at high speed, and therefore the electronic parts-mounting speed can be greatly enhanced.

What is claimed is:

1. An electronic parts-mounting method comprising the steps of:
   (a) preparing a parts mounting apparatus including (i) a board transfer path having a board disposed thereon for movement in a board feeding direction along said board transfer path, (ii) a parts supply portion that supplies electronic parts to be mounted on said board, (iii) a head portion including at least one pair of nozzles arranged substantially in parallel with said board feeding direction and at least one pair of nozzles arranged in a direction substantially perpendicular to said board feeding direction and (iv) a recognition unit including a line sensor;
   (b) performing a pick up operation including employing said at least one pair of nozzles arranged substantially perpendicular to said board feeding direction to pick up two of said electronic parts from said electronic parts supply portions and employing said at least one pair of nozzles arranged substantially parallel to said board feeding direction to simultaneously pick up two of said electronic parts from said electronic parts supply portions;
   (c) thereafter, moving said head portion to move the electronic parts picked up by the nozzles to a position above said line sensor of said recognition unit;
   (d) thereafter, employing said recognition unit to simultaneously pick up by said line sensor plan images of said two of the electronic parts picked up by said at least one pair of nozzles arranged in said direction substantially perpendicular to said board feeding direction and then to recognize positions of said electronic parts;

(e) correcting the positions of said electronic parts in accordance with recognition results of step (d); and (f) subsequently mounting said electronic parts on said board, wherein:

step (a) further includes providing a plurality of said head portions and a plurality of said recognition units on opposite sides of said board transfer path for recognizing said electronic parts; and step (d) includes moving one of said head portions to a position above an associated recognition unit so that images of two electronic parts picked up by said at least one pair of nozzles of said one of said head portions arranged substantially perpendicular to said board feeding direction are simultaneously viewed by the associated recognition unit.

2. An electronic parts-mounting method comprising the steps of:

(a) preparing a plurality of unit electronic parts-mounting apparatuses each including (i) a board transfer path having at least one board disposed thereon for movement in a board feeding direction along said board transfer path, (ii) a parts supply portion that supplies electronic parts to be mounted on said at least one board, (iii) an even number of head portions, each of said head portions having at least one pair of nozzles arranged substantially in parallel with said board feeding direction and at least one pair of nozzles arranged in a direction substantially perpendicular to said board feeding direction, (iv) an even number of X-Y table mechanisms each associated with one of said head portions, and (v) a recognition unit including a line sensor;

(b) arranging said plurality of unit electronic parts-mounting apparatuses in such juxtaposed relationship that said board transfer paths are continuous with each other;

(c) setting an electronic parts-mounting program for controlling operations of the X-Y table mechanisms and the head portions so as to make a time period required for the respective head portions to effect mounting of electronic parts approximately equal to each other; and (d) operating said X-Y table mechanisms to move said head portions separately from each other in both an X-direction and a Y-direction according to said program to (i) perform a pick up operation including employing said at least one pair of nozzles arranged substantially parallel with said board feeding direction to simultaneously pick up two of said electronic parts from said electronic parts supply portions and employing said at least one pair of nozzles arranged substantially perpendicular to said board feeding direction to pick up two of said electronic parts from said electronic parts supply portions, (ii) move said head portions in a direction substantially parallel to said board feeding direction, thereby moving the electronic parts picked up by said at least one pair of nozzles arranged substantially perpendicular to said board feeding direction to a position above said line sensor included in said recognition unit to enable plan images of said two of the electronic parts picked up by said at least at least one pair of nozzles arranged substantially perpendicular to said board feeding direction to be picked up simultaneously by said line sensor, and (iii) mount each one of said electronic parts picked up by said at least one pair of nozzles arranged substantially parallel with said board feeding direction and each one of said electronic parts picked up by said at least one pair of nozzles arranged in a direction substantially perpendicular to said board feeding direction on said at least one board being transferred along said board transfer path to be fixed in predetermined positions thereon, wherein:

step (a) further includes providing a plurality of said head portions and a plurality of said recognition units on opposite sides of said board transfer path for recognizing said electronic parts; and step (d) includes moving one of said head portions to a position above an associated recognition unit so that images of two electronic parts picked up by said at least one pair of nozzles of said one of said head portions arranged substantially perpendicular to said board feeding direction are simultaneously viewed by the associated recognition unit.

3. The method according to claim 2, wherein step (a) further includes providing said electronic parts supply portions with parts feeders juxtaposed to each other in the X-direction so that a distance between nozzles of said plurality of nozzles in an X-direction is an integral multiple of a pitch of said juxtaposed parts feeders.

4. The method according to claim 3, wherein:

step (a) further includes providing a plurality of said recognition units on opposite sides of said board transfer path for recognizing the electronic parts; and step (d) includes moving one of said head portions to a position above an associated recognition unit so that images of two electronic parts picked up by said at least one pair of nozzles of said one of said head portions arranged substantially perpendicular to said board feeding direction are viewed by the associated recognition unit.

5. An electronic parts-mounting method according to claim 2, wherein step (b) further comprises:

(i) projecting at least one nozzle of said at least one pair of nozzles arranged substantially parallel with said board feeding direction and said at least one pair of nozzles arranged in a direction substantially perpendicular to said board feeding direction;

(ii) moving said head portion downward;

(iii) picking up the electronic part from an associated electronics parts supply portion by said nozzle projected in step (i);

(iv) moving said head portion upward after the electronic part is picked up in step (iii); and (v) repeating steps (i) through (iv), thereby causing all of said nozzles of said at least one pair of nozzles arranged substantially parallel with said board feeding direction and said at least one pair of nozzles arranged in a direction substantially perpendicular to said board feeding direction to pick up an electronic part, respectively.

6. The method according to claim 2, wherein said plurality of electronic parts-mounting apparatuses arranged in step (b) are linearly continuous with each other.

7. The method according to claim 3, wherein said plurality of electronic parts-mounting apparatuses are linearly continuous with each other.

8. The method according to claim 1, wherein said plurality of electronics parts-mounting apparatuses are linearly continuous with each other.

9. The method according to claim 2, wherein said plurality of electronics parts-mounting apparatuses are linearly continuous with each other.

* * * * *